(12) United States Patent
Kamiya

(10) Patent No.: US 6,487,707 B1
(45) Date of Patent: Nov. 26, 2002

(54) LAYOUT DESIGN SYSTEM OF SEMICONDUCTOR IC DEVICE, LAYOUT DESIGN METHOD OF SEMICONDUCTOR IC DEVICE AND COMPUTER-READABLE RECORDING MEDIUM ON WHICH PROGRAMS FOR ALLOWING COMPUTER TO EXECUTE RESPECTIVE MEANS IN THE SYSTEM OR RESPECTIVE STEPS IN THE METHOD ARE RECORDED

(75) Inventor: Yasuo Kamiya, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/533,171

(22) Filed: Mar. 22, 2000

(30) Foreign Application Priority Data

Oct. 25, 1999 (JP) ............................................ 11-302994

(51) Int. Cl.[7] .............................................. G06F 17/50
(52) U.S. Cl. .................................. 716/8; 716/6; 716/10
(58) Field of Search ................................ 716/6, 7, 8, 9, 716/10, 11, 1, 16–18; 703/19

(56) References Cited

U.S. PATENT DOCUMENTS

| | | | | |
|---|---|---|---|---|
| 5,077,676 A | * | 12/1991 | Johnson et al. ............... | 703/19 |
| 5,686,845 A | * | 11/1997 | Erdal et al. ................... | 326/101 |
| 5,774,371 A | * | 6/1998 | Kawakami ..................... | 716/10 |
| 5,838,581 A | * | 11/1998 | Kuroda .......................... | 716/6 |
| 5,917,729 A | * | 6/1999 | Naganuma et al. ............ | 716/10 |
| 5,923,570 A | * | 7/1999 | Shigemoto .................... | 716/16 |
| 6,053,950 A | * | 4/2000 | Shinagawa .................... | 703/19 |
| 6,080,206 A | * | 6/2000 | Tadokoro et al. ............. | 716/10 |
| 6,260,181 B1 | * | 7/2001 | Inoue ............................ | 716/10 |
| 6,311,313 B1 | * | 10/2001 | Camporese et al. .......... | 716/21 |

\* cited by examiner

Primary Examiner—Matthew Smith
Assistant Examiner—Paul Dinh
(74) Attorney, Agent, or Firm—Arent Fox Kintner Plotkin & Kahn, PLLC

(57) ABSTRACT

A floor plan and a cell layout in each of a plurality of blocks are designed. A clock tree is generated in such a manner that the clock skew in each lower level block is minimum. Placement position of a root clock driver and information about an area where the cells can be placed are given to the upper level block. An average delay value of delay values from the root clock driver to a distal buffer is obtained for each block. A flock tree is generated based on these information in such a manner that the clock skew between the higher level block is minimum. If a buffer is newly generated, then its placement position is adjusted based on the cell layout of the lower level block. Wire is distributed in the lower and then in the higher level blocks.

15 Claims, 20 Drawing Sheets

LAYOUT DESIGN SYSTEM OF SEMICONDUCTOR IC DEVICE, LAYOUT DESIGN METHOD OF SEMICONDUCTOR IC DEVICE AND COMPUTER-READABLE RECORDING MEDIUM ON WHICH PROGRAMS FOR ALLOWING COMPUTER TO EXECUTE RESPECTIVE MEANS IN THE SYSTEM OR RESPECTIVE STEPS IN THE METHOD ARE RECORDED

FIELD OF THE INVENTION

The present invention relates to a layout design apparatus of semiconductor IC device, a layout design system of semiconductor IC device, a layout design method of semiconductor IC device, and a computer-readable recording medium on which programs for allowing a computer to execute respective means in the system or respective steps in the method are recorded.

BACKGROUND OF THE INVENTION

Generally, a semiconductor IC device has a sequential circuit such as a flip-flop which is operated in synchronization with a clock. A clock signal supplied from inside or outside the IC chip generally passes through several buffers so as to reach the flip-flop. For this reason, the time required for the clock signal to reach the respective flip-flop circuit, namely, the delay is occasionally different from each other per flip-flop circuit, and this is called as clock skew. When the clock skew is large, there is a possibility that the circuits malfunction. As a result, it is necessary to reduce the clock skew as small as possible.

Conventionally, in the layout design of the semiconductor IC device, wires are automatically distributed between buffer cells and between the buffer cells and flip-flops using Design Automation. In general, Design Automation generates a clock tree such that the clock skew is minimum in a layout block (hereinafter, block). However, in the case of a hierarchical layout having a plurality of blocks, clock skew between the blocks becomes a problem. In order to set the clock skew between the blocks to minimum, there is known a method of setting the delay of respective blocks same to and also make the wiring lengths between terminals to which a clock signal is supplied and the blocks same.

However, in the above conventional method, there is a disadvantage that a degree of freedom of the layout design is reduced, and there is a problem that workload and time are required because a designer makes the design manually.

SUMMARY OF THE INVENTION

It is an object of the present invention to provide a layout design system of semiconductor IC device and a layout design method of semiconductor IC device which are capable of automatically designing a hierarchical layout having a plurality of blocks so that clock skew between the blocks becomes as small as possible, and relates to a computer-readable recording medium on which programs for allowing a computer to execute respective means in the system or respective steps in the method are recorded.

In order to achieve the above object, the present invention designs a layout of a semiconductor IC device according to the following steps. After a floor plan and cell layout in each of blocks are designed, a clock tree is generated in the block at the lower level of hierarchy so that clock skew in each of the blocks becomes minimum.

Then, a placement position of a clock buffer (root clock driver) to be a basis of a clock signal in each of the blocks and information about an area where cells can be placed are given to the higher level block, and an average delay value of delay values from the clock buffer to a distal buffer is obtained for each of the blocks. A clock tree is generated in the block at the higher level of hierarchy based on these information so that the clock skew between the blocks becomes minimum.

In the case where a buffer, which is newly generated at the time of generating the clock tree in the block at the higher level of hierarchy, exists, a placement position of the generated buffer is returned to the block at the lower level of hierarchy so as to be adjusted based on the cell layout of the corresponding block. A wire is distributed in each of the block at the block at the lower -level of hierarchy, and a wire is distributed between the blocks at the block at the higher level of hierarchy.

In another manner, after the clock tree is generated at the block at the higher level of hierarchy so that the clock skew between the blocks becomes minimum, in the case where a buffer which is newly generated at the time of generating the clock tree exists, the cell layout in each of the blocks is designed by taking the placement position of the generated buffer into consideration. Thereafter, the clock tree in each of the blocks is designed at the block at the lower level of hierarchy, and a wire may be distributed.

Other objects and features of this invention will become apparent from the following description with reference to the accompanying drawings.

DESCRIPTION OF THE PREFERRED EMBODIMENTS

Figure 1:
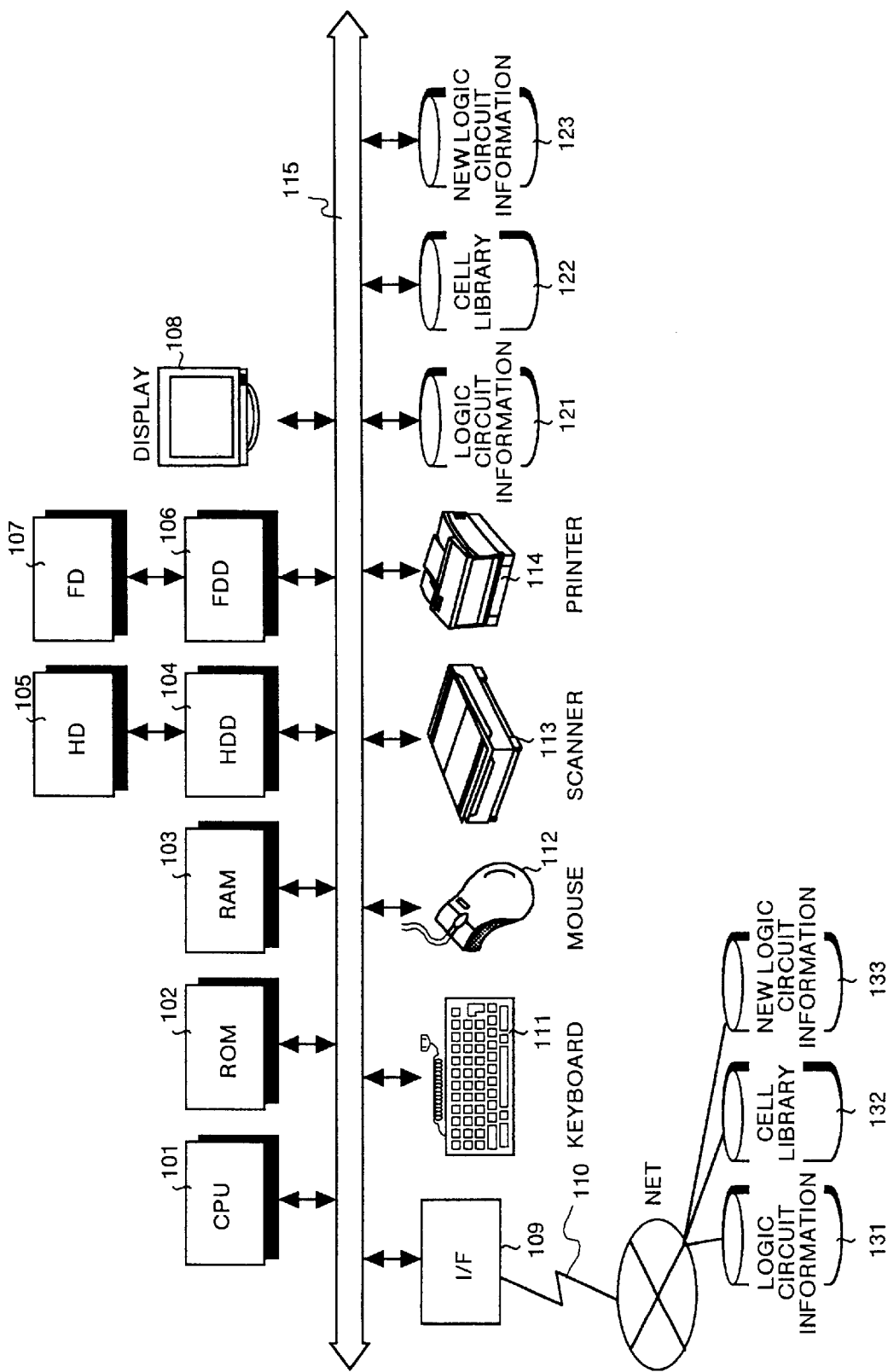
FIG. 1 is a block diagram showing a hardware structure of a layout design apparatus according to the present invention.

Preferred embodiments of a layout design system of semiconductor IC device, a layout design method of semiconductor IC device and a computer-readable recording medium on which programs for allowing a computer to execute respective means in the system or respective steps in the method are recorded according to the present invention are explained below with reference to the drawings. The same reference numerals are provided to the same components in the layout diagrams.

FIG. 1 is a block diagram showing a hardware structure of a layout design apparatus as the layout design system of semiconductor IC device according to the present invention. In FIG. 1, 101 is a CPU that controls the whole apparatus, 102 is ROM that stores a boot program and the like thereon, 103 is RAM which is used as a work area of the CPU, 104 is HDD (hard disk drive) that controls reading/writing of data with respect to a HD (hard disk) 105 in accordance with the control of the CPU 101. The HD 105 stores the data written by the control of the HDD 104 thereon.

Further, 106 is FDD (floppy disk drive) that controls reading/writing of data with respect to a FD (floppy disk) 107 in accordance with the control of the CPU 101, and 108 is a display for displaying layout diagrams and other information thereon. The FD 107 is an example of a detachable recording medium that stores the data written by the control of the FDD 106 thereon.

Further, 109 is an interface (I/F) which is connected with a network NET through a communication line 110 and controls the network NET and an internal interface, 111 is a keyboard having keys for inputting characters, numerical values and various instructions, 112 is a mouse for moving a cursor, selecting a range and the like, 113 is a scanner for optically reading an image, 114 is a printer for printing a layout diagram or other image information, and 115 is a bus for connecting the above respective sections.

Further, various databases (like a logic circuit information database 121, a cell library database 122, a new logic circuit information database 123) that store programs, data and the like for layout design of a semiconductor IC device are connected to the bus 115.

Information and the like about layouts of logic circuits which were designed in the past are stored in the logic circuit information database 121, and information about various cells are stored in the cell library database 122. Moreover, information and the like about layouts of logic circuits which are designed newly are stored in the new logic circuit information database 123.

The above-mentioned databases (the logic circuit information database 121, cell library database 122 and new logic circuit information database 123) are the components of the layout design apparatus. These databases are stored in specified areas of the HD 105. However, the structure is not limited to this, a structure may be such that all or some of the databases are connected through the network NET. A logic circuit information database 131, cell library database 132 and new logic circuit information database 133 which are connected with the network is an example of such a structure.

Figure 2:
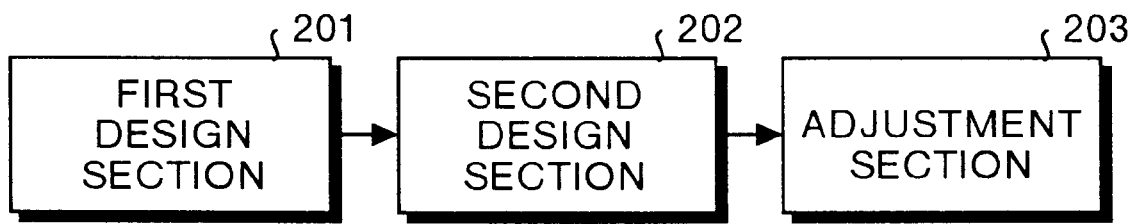
FIG. 2 is a functional block diagram showing a functional structure of the layout design apparatus according to a first embodiment of the present invention.

FIG. 2 is a functional block diagram showing a functional structure of the layout design apparatus as the layout design system of semiconductor IC device according to the first embodiment of the present invention. As shown in FIG. 2, the layout design apparatus of semiconductor IC device is composed of a first design section 201, a second design section 202 and an adjustment section 203.

The first design section 201 specifies a placement position of a clock buffer to be a basis of a clock signal in each of a plurality of blocks where a cell layout is determined so as to design a clock tree in each of the blocks.

Further, the second design section 202 designs clock trees between the plural blocks based on the placement positions of the clock buffers in the respective blocks specified by the first design section 201 and based on delay values of the clock signals propagated within the respective blocks which are calculated based on placement positions of block buffers for adjusting clock skew in the respective blocks.

Further, if there exists a buffer added by the second design section 202, the adjustment section 203 adjusts a placement position of the added buffer based on the cell layout of the corresponding block.

The CPU 101 and the like execute a command process according to a command described in the program recorded on the recording medium such as the ROM 102, RAM 103 or HD 105 so that the first design section 201, second design section 202 and adjustment section 203 realize the respective functions.

Figure 3:
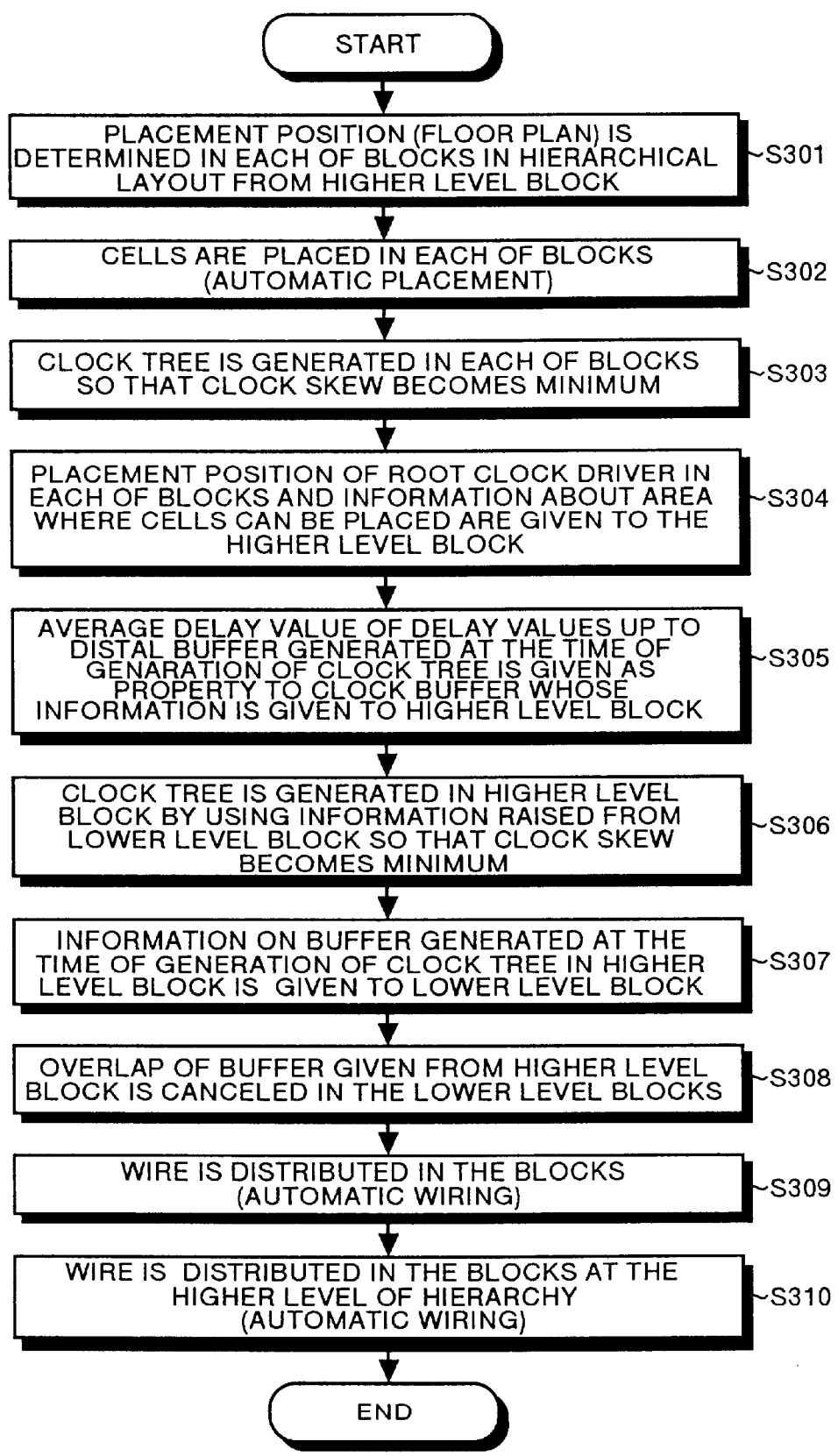
FIG. 3 is a flow chart showing a layout design method according to the first embodiment of the present invention.
Figure 12:
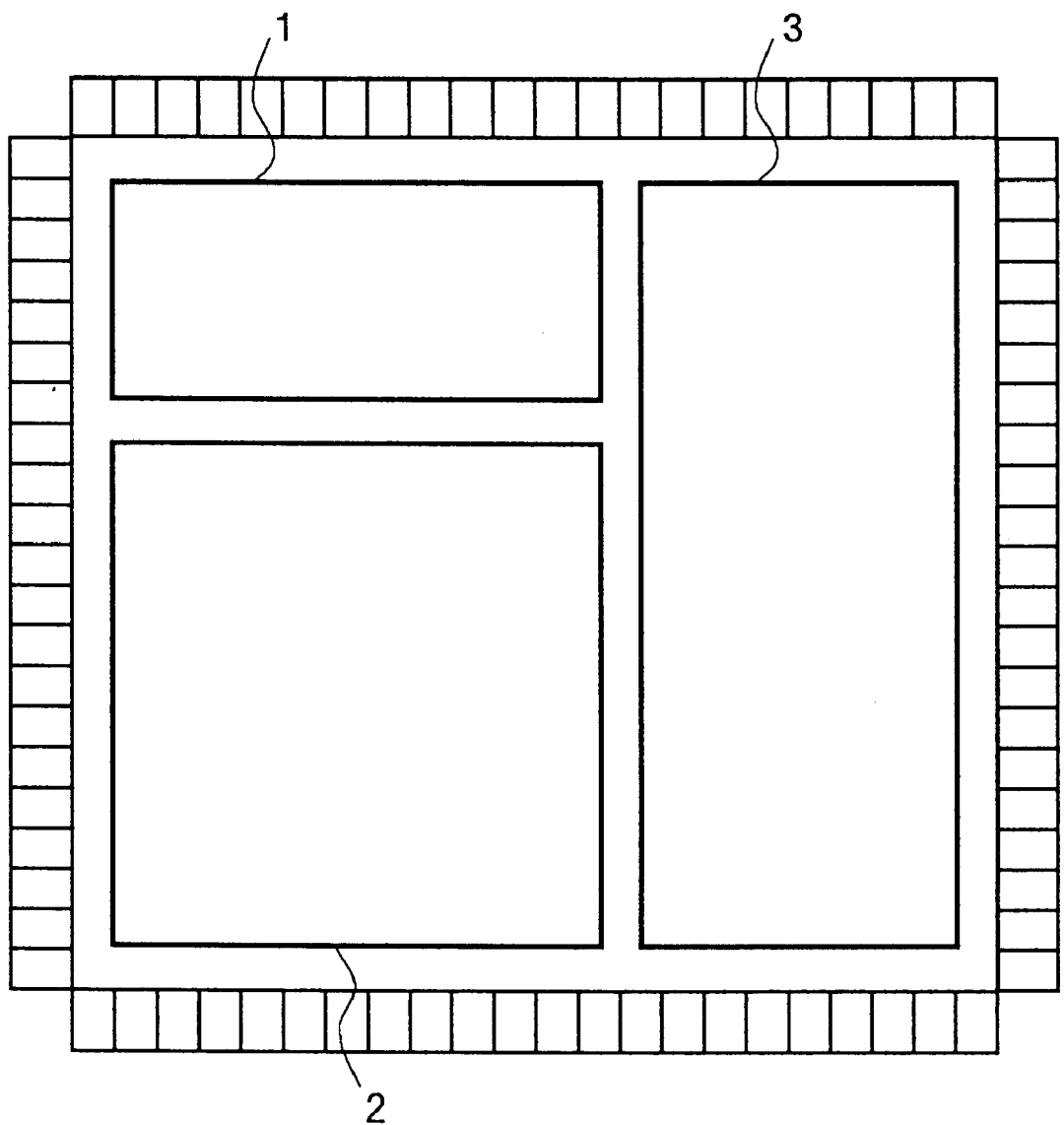
FIG. 12 is a layout diagram showing one example of the layout during designing according to the present invention.

FIG. 3 is a flow chart showing the layout design method according to the first embodiment of the present invention. When a layout design process of the first embodiment is started, at first a floor plan is designed (step S301). In the floor plan design, as shown in the layout diagram of FIG. 12 for example, the placement positions of blocks 1, 2 and 3 are designed in the order from the blocks at the higher level of hierarchy (hereinafter, higher level blocks) to the blocks at the lower level of hierarchy (hereinafter, lower level blocks) in the hierarchical layout.

The cells in each of the blocks are then placed automatically based on the floor plans generated at step S301 (step S302). Clock trees are generated respectively in such a manner that the clock skew becomes minimum in each of the blocks (step S303).

Figure 13:
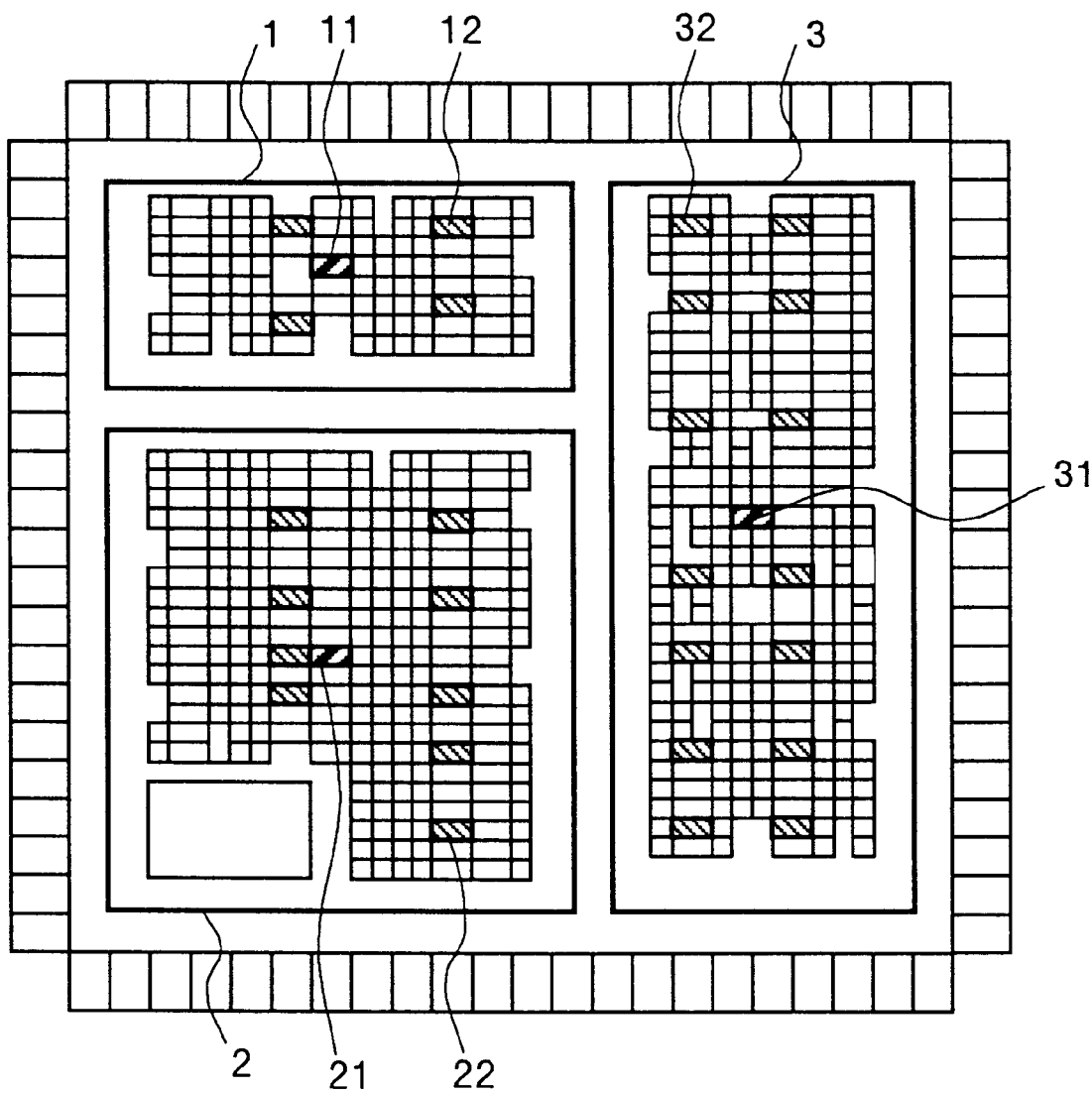
FIG. 13 is a layout diagram showing another example of the layout during designing according to the present invention.

While generating the clock trees at step S303, as shown in the layout diagram of FIG. 13 for example, one clock buffer 11, 21 and 31 (cells hatched by the thick lines) which are the generators of a clock are placed respectively in the blocks 1, 2 and 3.

Further, buffers (cells hatched by thin lines) 12, 22 and 32 for adjusting the clock skew are additionally generated respectively for the blocks 1, 2 and 3, and placed suitably in the respective blocks 1, 2 and 3. Hereinafter, the clock buffers 11, 21 and 31 which are the generators of a clock are referred to as root clock drivers An order to discriminate them from the other buffers 12, 22 and 32 which were additionally generated.

Figure 14:
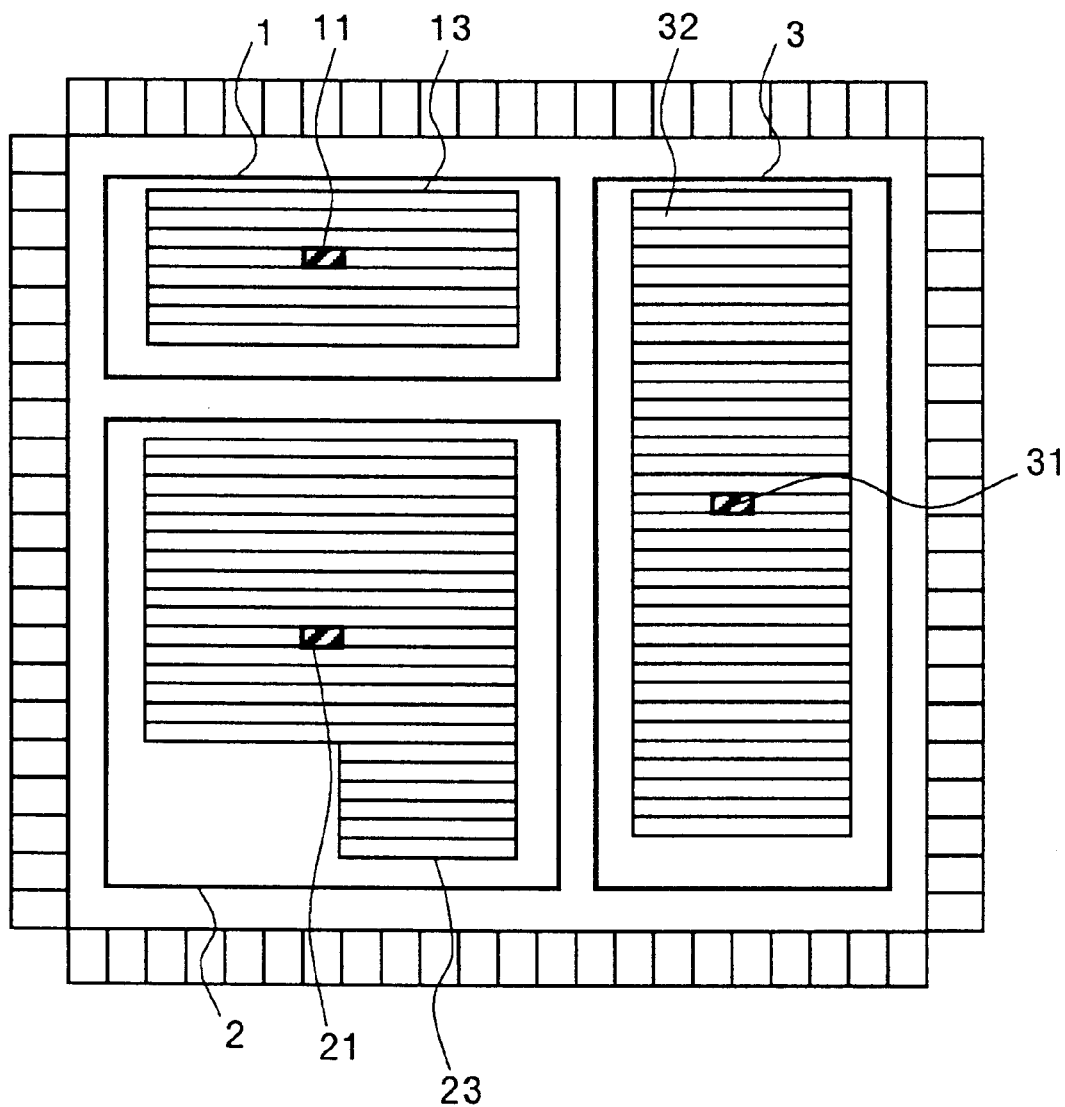
FIG. 14 is a layout diagram showing still another example of the layout during designing according to the present invention.

The placement positions of the root clock drivers in the respective blocks and information about areas where the cells can be placed (hereinafter, sites) are given to the higher level block based on the clock trees in the lower level block generated at step S303 (step S304). Namely, as shown in the layout diagram of FIG. 14 for example, information about that the root clock drivers 11, 21 and 31 and the sites 13, 23 and 33 are placed respectively in the blocks 1, 2 and 3 is given to the higher level block.

Next, an average delay value of delay values from the root clock driver to the distal buffer in the clock tree in each of the blocks generated at step S303 is given as a property to each of the root clock drivers whose information was given to the higher level block at step S304 (step S305). Then, a clock trees is generated in the higher level block based on the information obtained from the lower level block in such a manner that the clock skew becomes minimum (step S306).

Figure 15:
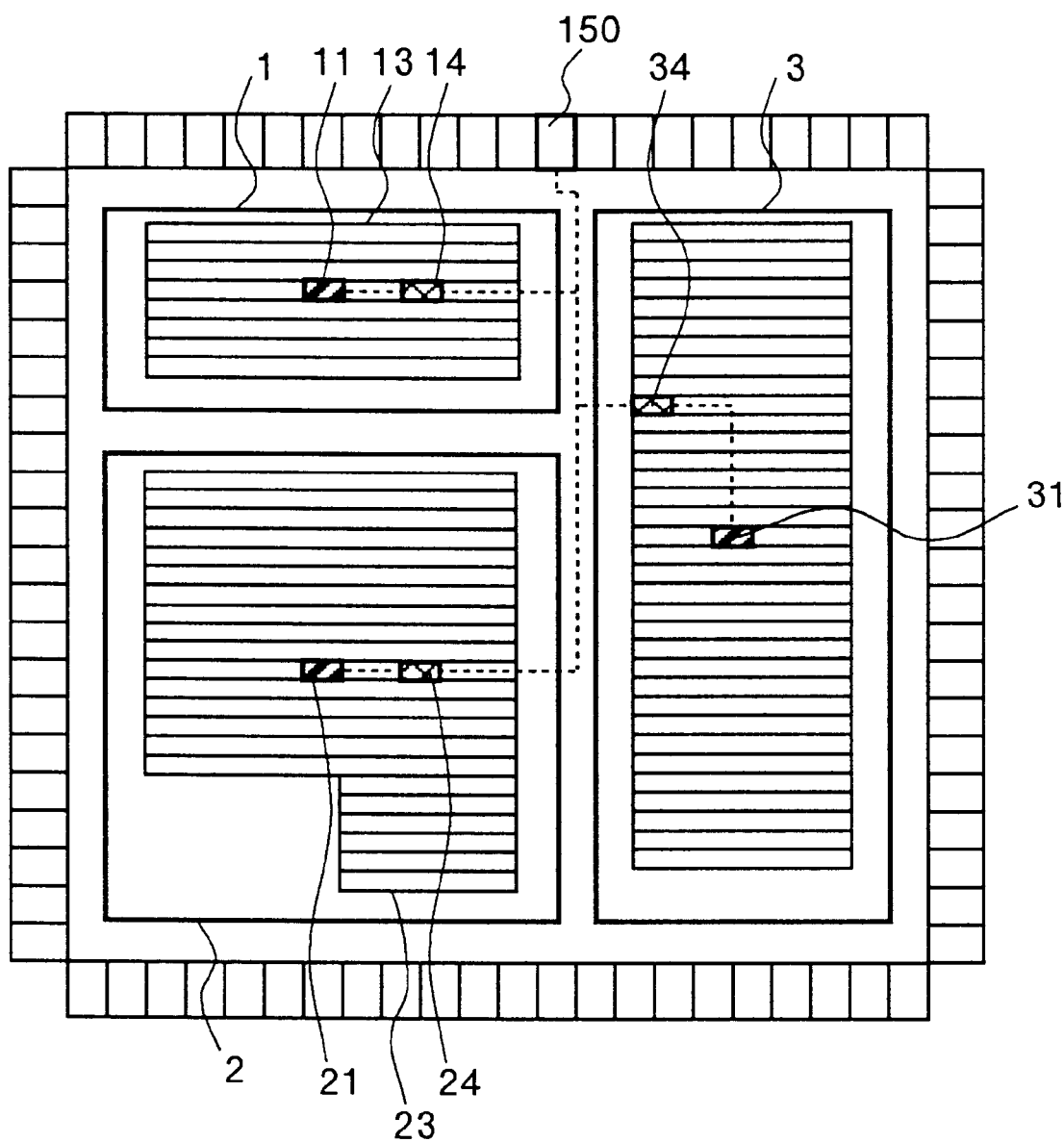
FIG. 15 is a layout diagram showing still another example of the layout during designing according to the present invention.

While generating the clock trees at step S306, as shown in the layout diagram of FIG. 15 for example, a terminal 150 to which a clock signal is supplied from the outside is specified. Moreover, the root clock drivers 11, 21 and 31 are regarded as distal cells. Then, buffers (screened cells) 14, 24 and 34 for adjusting the clock skew are additionally generated in respective blocks 1, 2 and 3 based on the average delay values given respectively to the root clock drivers 11, 21 and 31 at step S305 so as to be placed suitably in the respective blocks 1, 2 and 3. In FIG. 15, broken lines which continue from the clock supply terminal 150 through the buffers 14, 24 and 34 to the respective root clock drivers 11, 21 and 31 represent assumed wiring paths.

Figure 16:
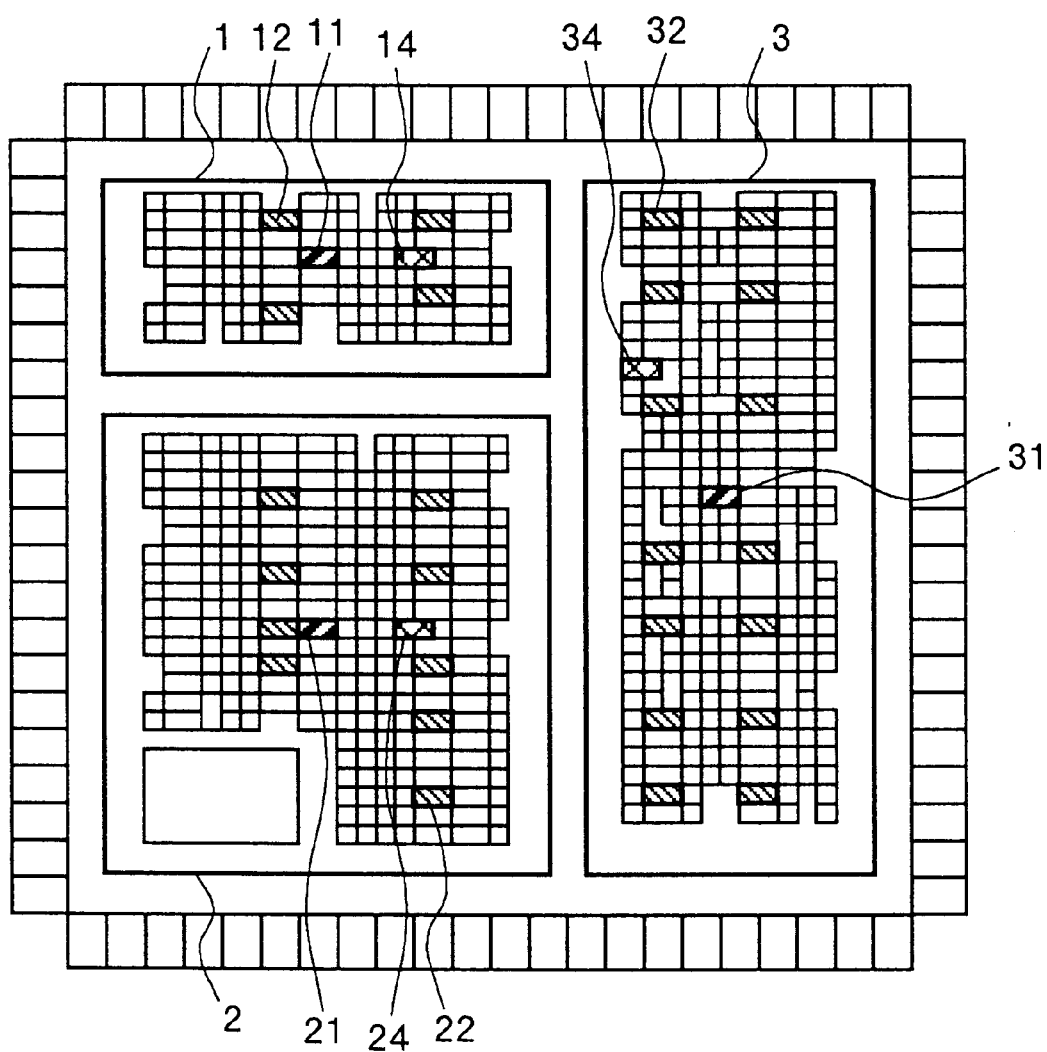
FIG. 16 is a layout diagram showing still another example of the layout during designing according to the present invention.

The information about the buffers 14, 24 and 34 in the higher level block which were additionally generated at step S306 is given to the lower level block (step S307). As a result, as shown in the layout diagram of FIG. 16 for example, information that the root clock drivers 11, 21 and 31, the buffers 12, 22 and 32 which were added at the time of generation of the clock trees in the lower level block, and the buffers 14, 24 and 34 which were added at the time of generation of the clock trees in the higher level block are placed respectively in the blocks 1, 2 and 3, is obtained.

Figure 17:
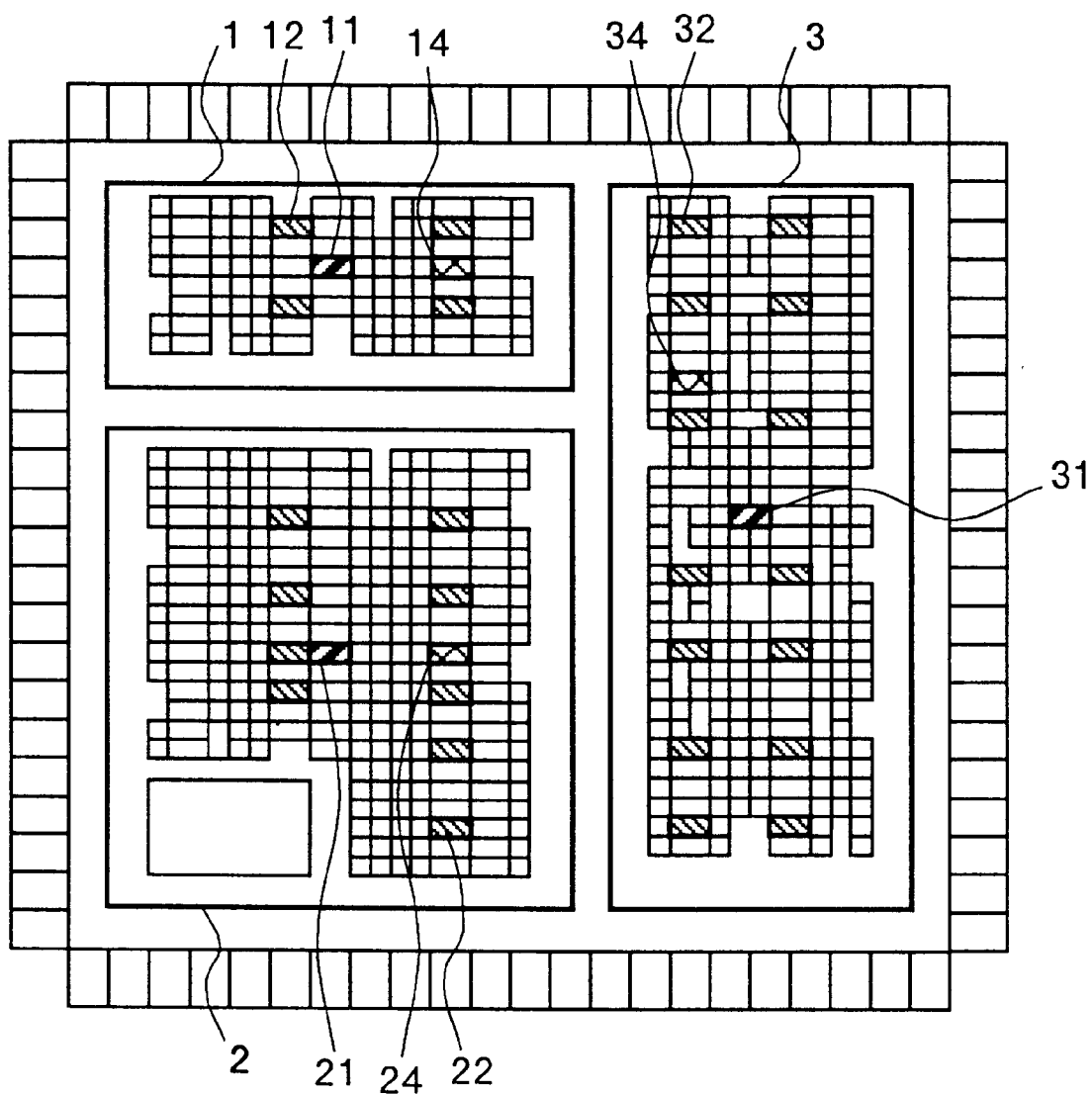
FIG. 17 is a layout diagram showing still another example of the layout during designing according to the present invention.

Next, overlap of the buffers 14, 24 and 34 given from the higher level block is canceled in the respective blocks in the lower level block (step S308). In other words, as shown in the layout diagram of FIG. 17 for example, placement positions of the buffers 14, 24 and 34 are adjusted so that the buffers 14, 24 and 34 coincide with a cell of the block cell group placed in the blocks at step S302.

When the overlap of the buffers is canceled, wires are distributed automatically in the respective blocks (step S309). Next, wires are distributed automatically in the blocks in higher level block (step S310). Then, the process is completed.

According to the first embodiment, when designing a hierarchical layout, not only the design of the respective blocks in the lower level block but also the design between the blocks with the condition that the clock skew is as small as possible can be designed automatically. Therefore, compared with the conventional case where equal-length wiring is executed, a degree of freedom of the layout is increased, and laborsaving in designing work and shortening of the design time can be realized.

The hardware structure of the layout apparatus as the layout design system of semiconductor IC device according to the second embodiment of the present invention is the same as that in the first embodiment shown in FIG. 1. Therefore, the description of the hardware structure is omitted.

Figure 4:
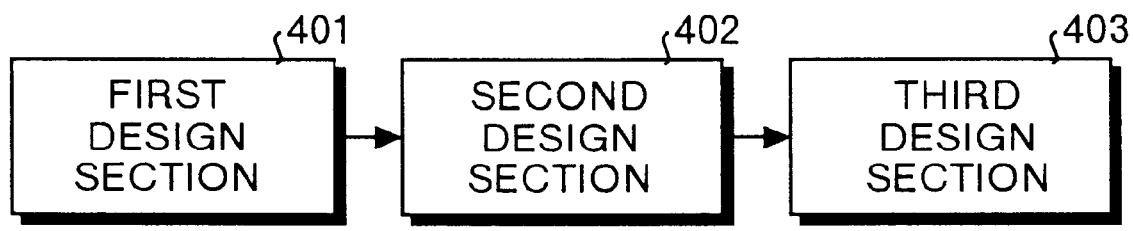
FIG. 4 is a functional block diagram showing a functional structure of the layout design apparatus according to a second embodiment of the present invention.

FIG. 4 is a functional block diagram showing a functional structure of the layout design apparatus as the layout design system of semiconductor IC device according to the second embodiment of the present invention. As shown in FIG. 4, the layout design apparatus of semiconductor IC device is composed of a first design section 401, a second design section 402 and a third design section 403.

The first design section 401 designs clock trees between a plurality of blocks based on placement positions of clock buffers to be a basis of the clock signals in the respective blocks and based on delay values of clock signals propagated in the respective blocks which are calculated based on placement positions of block buffers and sizes of the respective blocks.

Further, if there exists a buffer added by the first design section 401, the second design section 402 designs a cell layout in each of the blocks by taking the placement position of the added buffer into consideration. Moreover, the third design section 403 designs clock trees in the respective blocks based on the cell layouts designed by the second design section 402.

The CPU 101 and the like execute a command process according to a command described in the program recorded on the recording medium such as the ROM 102, RAM 103 or HD 105 so that the first design section 401, second design section 402 and the third design section 403 realize the respective functions.

Figure 5:
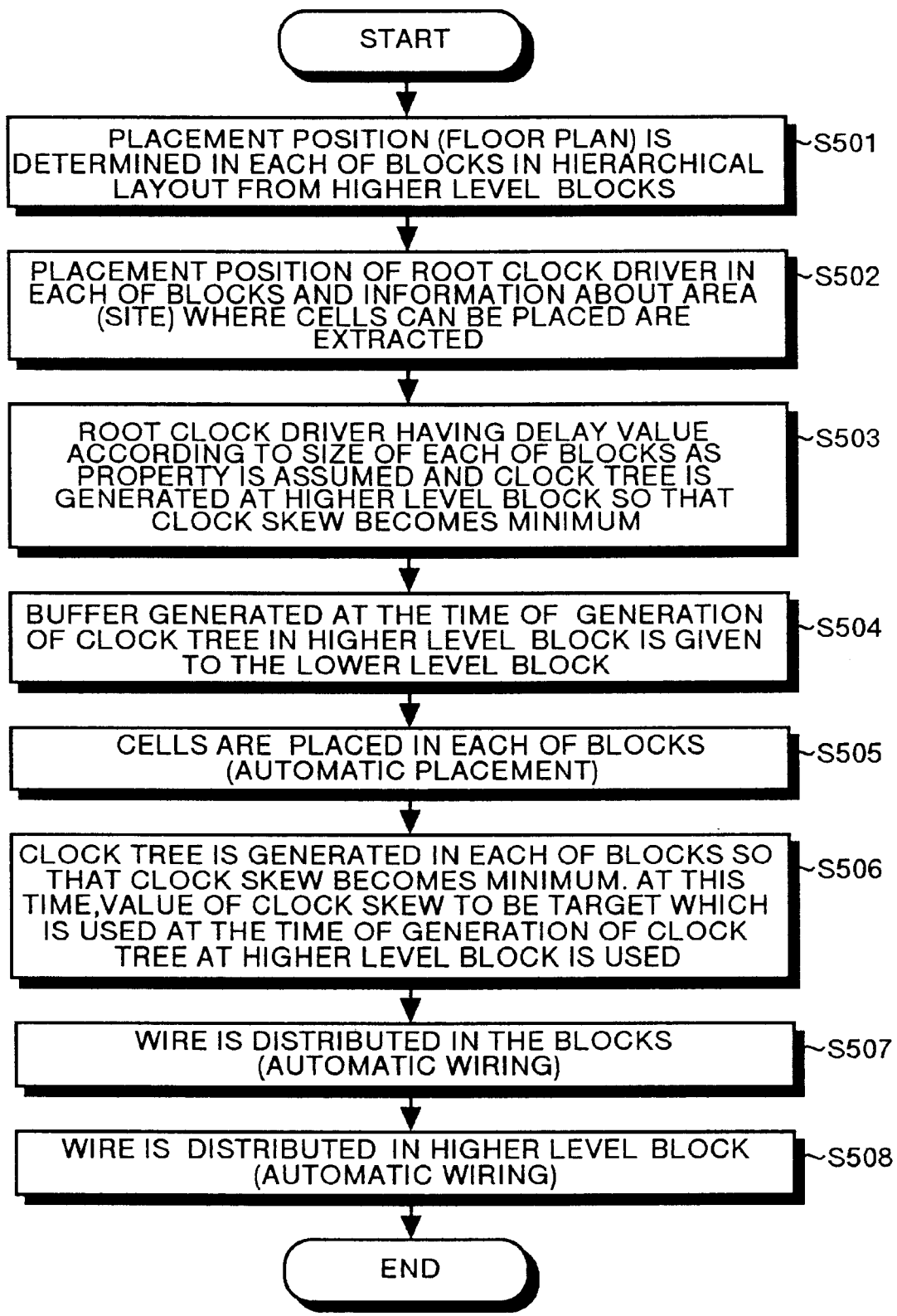
FIG. 5 is a flow chart showing a layout design method according to the second embodiment of the present invention.

FIG. 5 is a flow chart showing the layout design method according to the second embodiment of the present invention. When a layout design process of the second embodiment is started, at first a layout of each of the respective blocks, namely, a floor plan is designed in a hierarchical layout from the block at the higher level hierarchy (step S501). Next, placement position of the root clock drive in each of the blocks and information about a site are extracted based on the floor plan generated at step S501 (step S502).

A delay value which is in accordance with a size of the block is obtained for each of the blocks based on the placement positions of the root clock drivers and information about the sites extracted at step S502. Then, the root clock driver which has the delay value as property is assumed in each of the blocks.

A clock tree is generated in the higher level block based on the assumed root clock driver and a position of the terminal to which the clock signal is supplied so that the clock skew becomes minimum (step S503). At this time, a block buffer for adjusting the clock skew in each of the blocks is additionally generated so as to be suitably placed in each of the blocks.

When the buffers are additionally generated at step S503, the buffer information is given to the lower level block (step S504). The cells are automatically placed in each of the blocks by using the buffer information in the higher level block (step S505). A clock tree is generated in each of the blocks so that the clock skew becomes minimum (step S506). At this time, a value of the clock skew to be a target is a value which is used when the clock tree is generated in the higher level block at step S503.

Next, a wire is distributed automatically for each of the blocks (step S507), and a wire is distributed automatically in the higher level block (step S508). Then, the process is completed.

According to the second embodiment, when designing a hierarchical layout, not only the design of the lower level block but also the design between the blocks, with the condition that the clock skew is as small as possible can be automatically designed. Therefore, compared with the conventional case where equal-length wiring is made, a degree of freedom of the layout is increased, and laborsaving in the designing work and shortening of the design time can be realized.

In the third embodiment, in addition to the first embodiment, when a clock tree in the lower level block is generated, a plurality of root clock drivers with different delay values are prepared in each block, and when a clock tree in the higher level block is generated, a root clock driver with a suitable delay values is selected to be used.

The hardware structure of the layout design apparatus as the layout design system of semiconductor IC device according to the third embodiment of the present invention is the same as that in the first embodiment shown in FIG. 1. Therefore, the description of the hardware structure is omitted.

Figure 6:
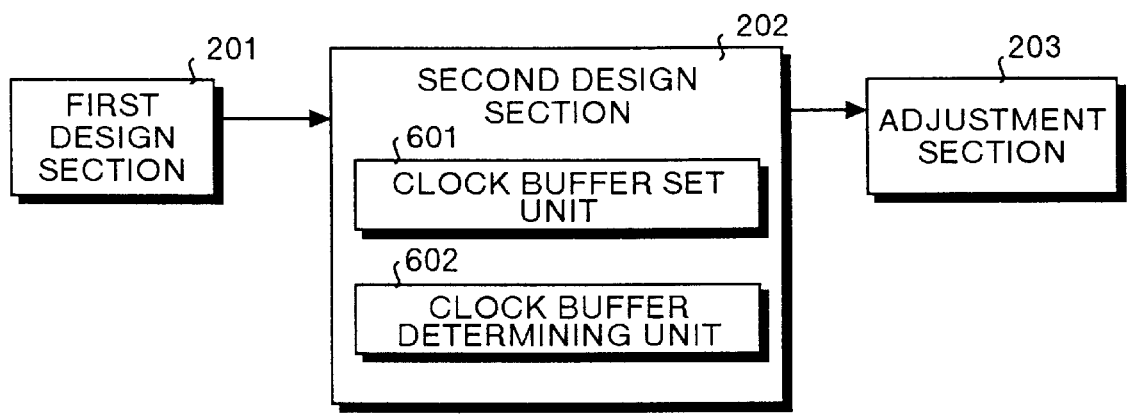
FIG. 6 is a functional block diagram showing a functional structure of the layout design apparatus according to a third embodiment of the present invention.

FIG. 6 is a functional block diagram showing a functional structure of the layout design apparatus as the layout design system of semiconductor IC device according to the third embodiment of the present invention. Here, the same reference numerals are given to the components which are the same as those in the first embodiment shown in FIG. 2, and the description thereof is omitted.

As shown FIG. 6, the layout design apparatus of semiconductor IC device is composed of the first design section 201, the second design section 202 and the adjustment section 203. The second design section 202 has a clock buffer set unit 601 and a clock buffer determining unit 602.

The clock buffer set unit 601 sets a plurality of clock buffers whose delay time is different from each other in each of the blocks. Moreover, the clock buffer determining unit 602 selects one of the clock buffers set by the clock buffer set unit 601 based on delay time in each of the blocks so as to determine the clock buffer in each of the blocks.

Here, the CPU 101 and the like execute a command process according to a command described in the program recorded on the recording medium such as the ROM 102, RAM 103 or HD 105 so that the clock buffer set unit 601 and clock buffer determining unit 602 realize the respective functions.

Figure 7:
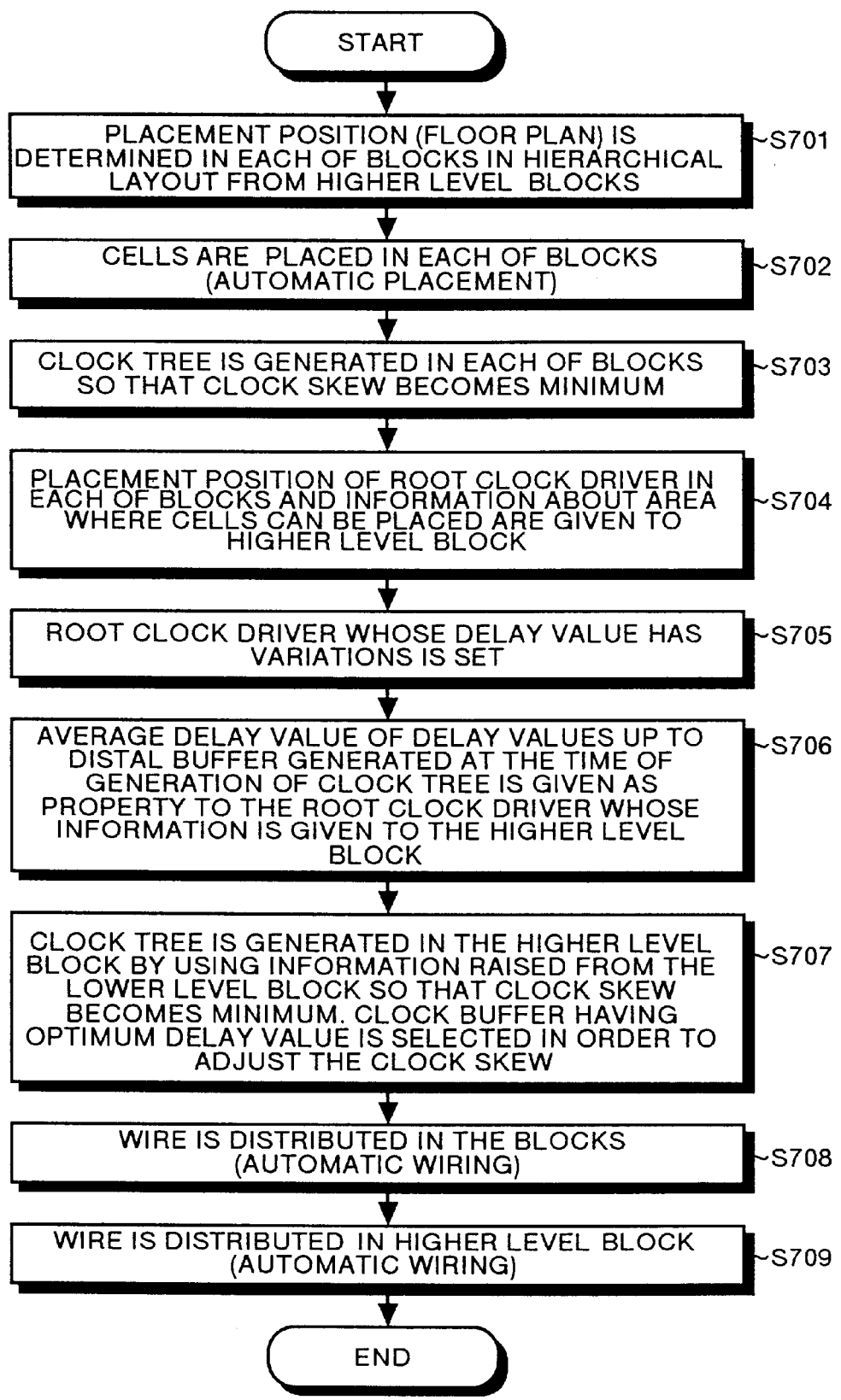
FIG. 7 is a flow chart showing a layout design method according to the third embodiment of the present invention.

FIG. 7 is a flow chart showing the layout design method according to the third embodiment of the present invention. When the layout design process of the third embodiment is started, at first a layouts of the respective blocks, namely, a floor plan is designed in the hierarchical layout from the higher level block (step S701). Next, cells in each of the blocks are placed automatically based on the floor plan generated at step S701 (step S702).

Root clock drives are placed so that clock skew becomes minimum in each of the blocks, and buffers for adjusting the clock skew are placed. As a result, a clock tree is generated (step S703).

Figure 18:
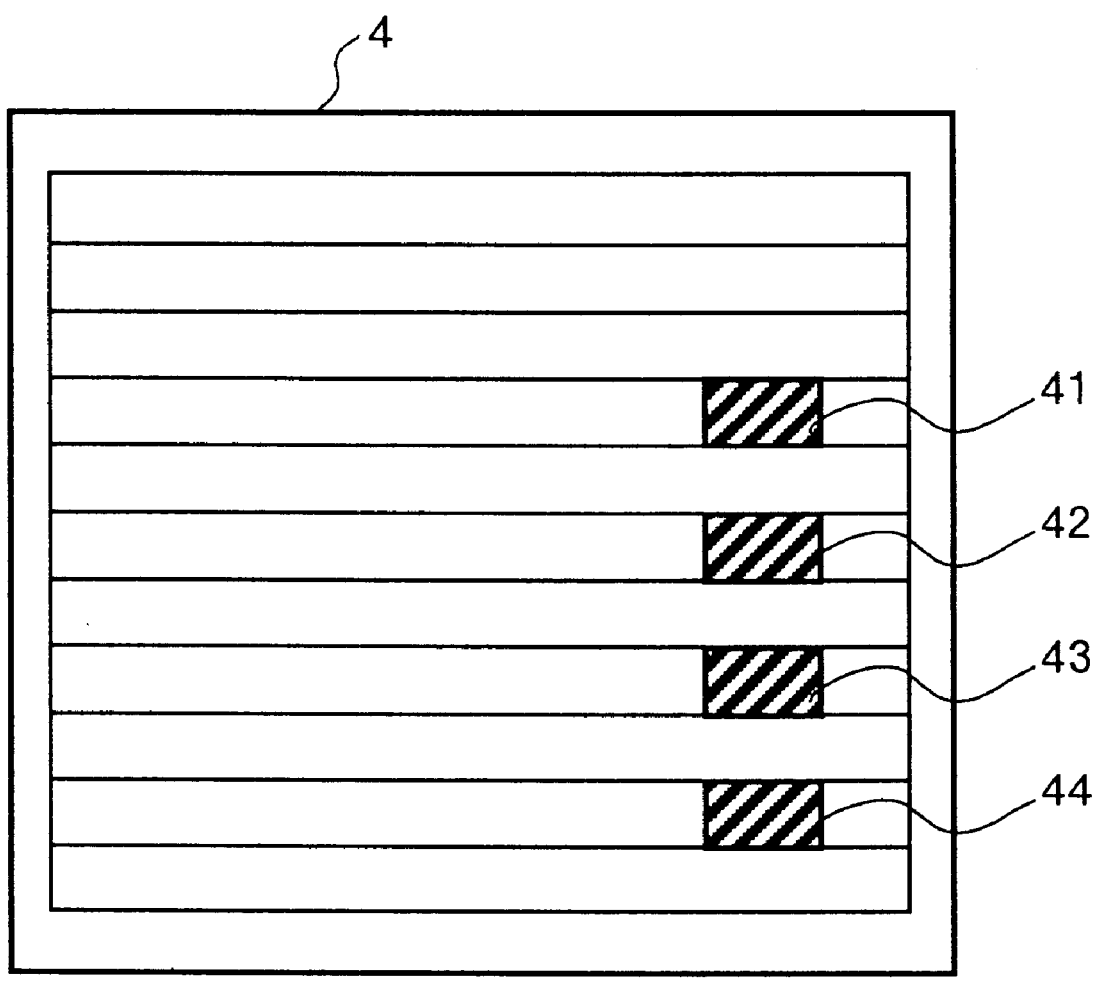
FIG. 18 is a layout diagram showing still another example of the layout during designing according to the present invention.

The placement positions of the root clock drivers and information about sites in each of the block are given to the higher level block based on the clock trees in the lower level block generated at step S703 (step S704). At this time, a plurality of root clock drivers with different delay values are set in each of the blocks (step S705). As shown in the layout diagram shown in FIG. 18 for example, particularly nonrestrictively but root clock drivers 41, 42, 43 and 44, for example, respectively having delay values of 1ns, 2ns, 3ns and 4ns are prepared in a block 4.

Next, an average delay value of delay values from the respective root clock drivers to a distal buffer in the clock tree in the lower level block is given as property to the respective root clock drivers whose information was given to the higher level block (step S706). Then, a clock tree is generated in the higher level block based on the information obtained from the lower level block so that the clock skew becomes minimum (step S707).

At this time, in order to make the clock skew between the blocks coincide with each other, a root clock driver having a suitable delay value is selected in each of the blocks. For this reason, in the third embodiment, a buffer for adjusting the clock skew is not generated in the higher level block.

Thereafter, a wire is distributed automatically in each of the blocks (step S708), and a wire is distributed automatically in the higher level block (step S709). Then, the process is completed.

According to the third embodiment, similarly to the first embodiment, also in the design between the blocks in the higher level block, the layout where the clock skew is as small as possible can be designed automatically. Moreover, when the clock tree in the higher level block is generated, since the buffer for adjusting the clock skew is not generated, it is not necessary to cancel overlap of buffers in the lower level block. Therefore, the layout process becomes more simple than that in the first embodiment.

In the fourth embodiment, in addition to the first embodiment, a block terminal which is assumed in order to calculate delay values when clock trees in the lower level block are generated is used as a virtual terminal, and a wire is distributed automatically by utilizing the position of the virtual terminal.

The hardware structure of the layout design apparatus as the layout design system of semiconductor IC device according to the fourth embodiment of the present invention is also the same as the hardware structure in the first embodiment shown in FIG. 1. Therefore, the description of the hardware structure is omitted.

Figure 8:
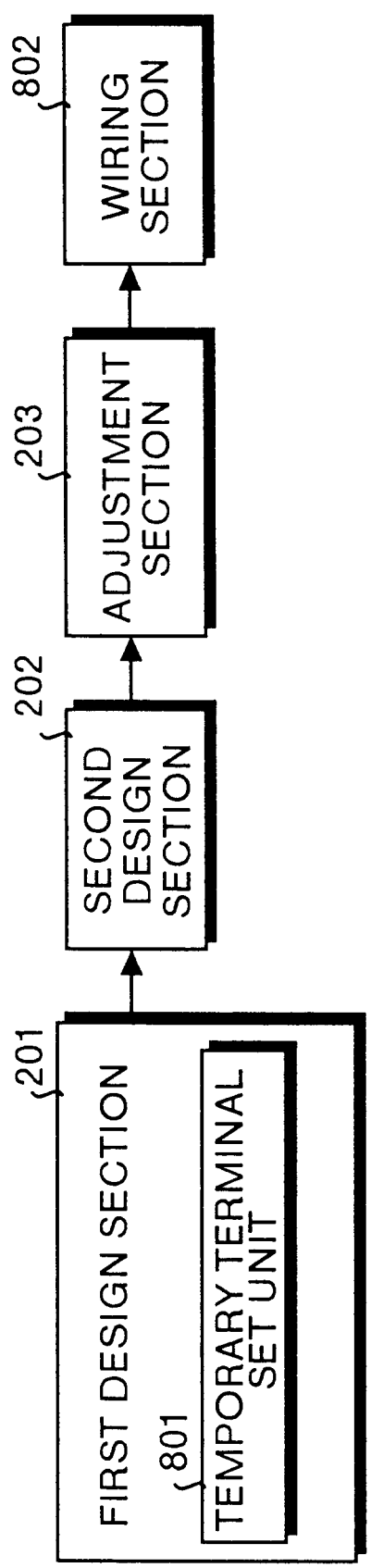
FIG. 8 is a functional block diagram showing a functional structure of the layout design apparatus according to a fourth embodiment of the present invention.

FIG. 8 is a functional block diagram showing a functional structure of the layout design apparatus as the layout design system of semiconductor IC device according to the fourth embodiment of the present invention. Here, the same reference numerals are given to the components which are the same as those in the first embodiment shown in FIG. 2, and the description thereof is omitted.

As shown in FIG. 8, the layout design apparatus of semiconductor IC circuit is composed of the first design section 201, the second design section 202, the adjustment section 203 and a wiring section 802. The first design section 201 has a temporary terminal set unit 801.

The temporary terminal set unit 801 sets a temporarily terminal in order to specify a wiring paths in the blocks to be the basis of designing clock trees in the blocks. Moreover, the wiring section 802 distributes wires in the blocks so that the wires pass through the temporary terminal set by the temporary terminal set unit 801.

The CPU 101 and the like execute a command process according to a command described in the program recorded on the recording medium such as the ROM 102, RAM 103 or HD 105 so that the temporary terminal set unit 801 and wiring section 802 realize the respective functions.

Figure 9:
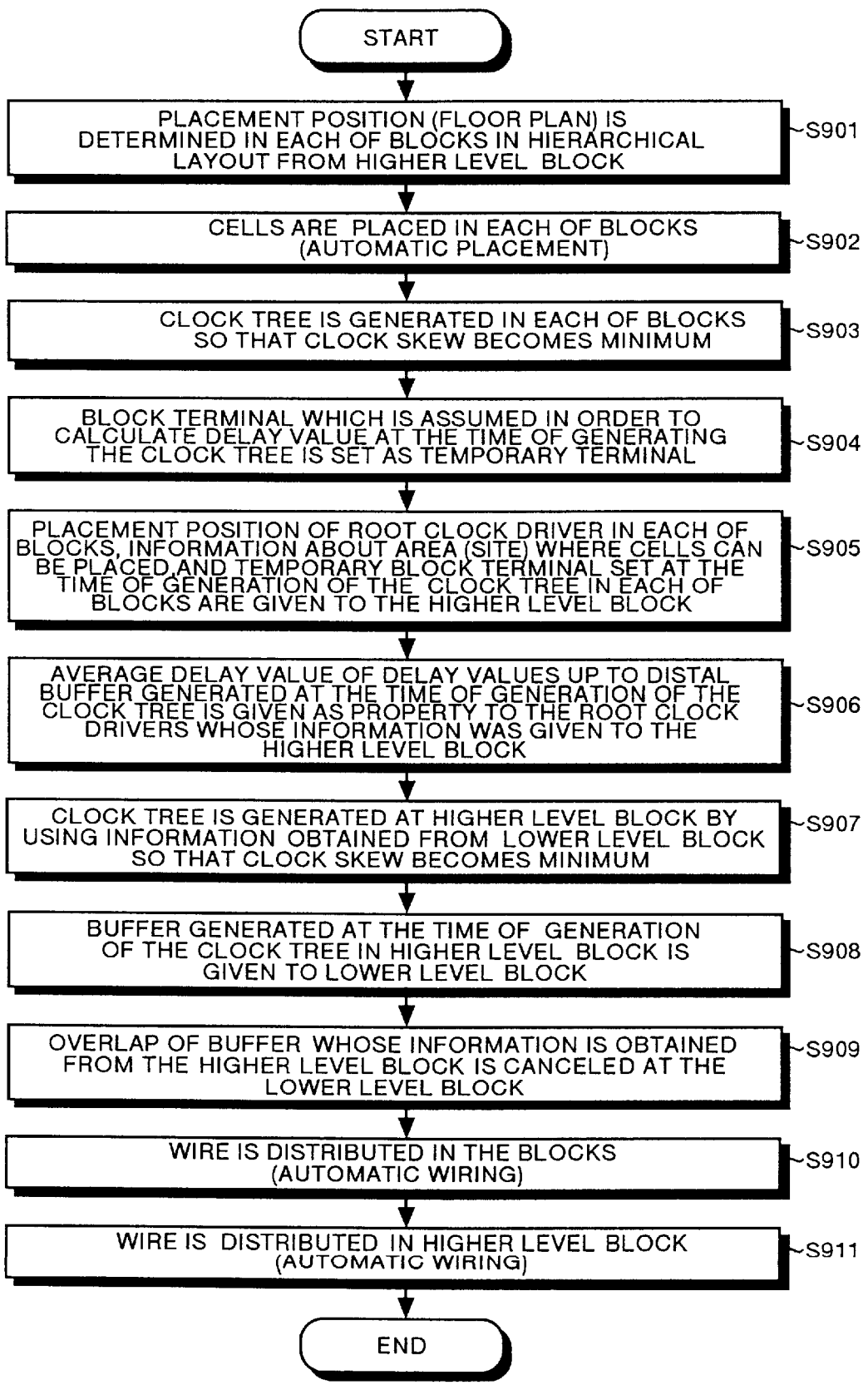
FIG. 9 is a flow chart showing a layout design method according to the fourth embodiment of the present invention.

FIG. 9 is a flow chart showing the layout design method according to the fourth embodiment of the present invention. When the layout design process of the fourth embodiment is started, at first the layout in each of the blocks, namely the floor plan is designed in the hierarchy layout from the higher level block (step S901). Next, cells in each of the blocks are placed automatically based on the floor plans generated at step S901 (step S902).

When the cell layout in the block is completed, a root clock driver is placed so that clock skew becomes minimum and buffers for adjusting the clock skew are placed in each of the blocks. As a result, a clock tree is generated (step S903). At this time, in order to calculate a delay value, a block terminal for temporarily setting a wiring path is assumed in each of the blocks.

Next, the block terminals assumed at step S903 are set as temporary terminals (step S904). The placement position of the temporary terminal as well as the placement position of the root clock driver in each of the blocks and information about a site are given to the higher level block (step S905).

Next, an average delay value of the delay values from the root clock driver to a distal buffer in the clock tree at the lower level block is given as property to each of the root clock drivers whose information was given to the higher level block (step S906). A clock trees is generated based on the information obtained from the lower level block so that the clock skew becomes minimum in the higher level block (step S907) At this time, a buffer for adjusting the clock skew is additionally generated in each of the blocks and suitably placed in each of the blocks.

Next, the information about the buffers in the higher level block additionally generated at step S907 is given to the lower level block (step S908). Overlap of the buffer whose information is obtained from the lower level block is canceled in the blocks in the lower level block (step S909). After the overlap of the buffers is canceled, a wire is distributed automatically in each of the blocks (step S910).

Figure 19:
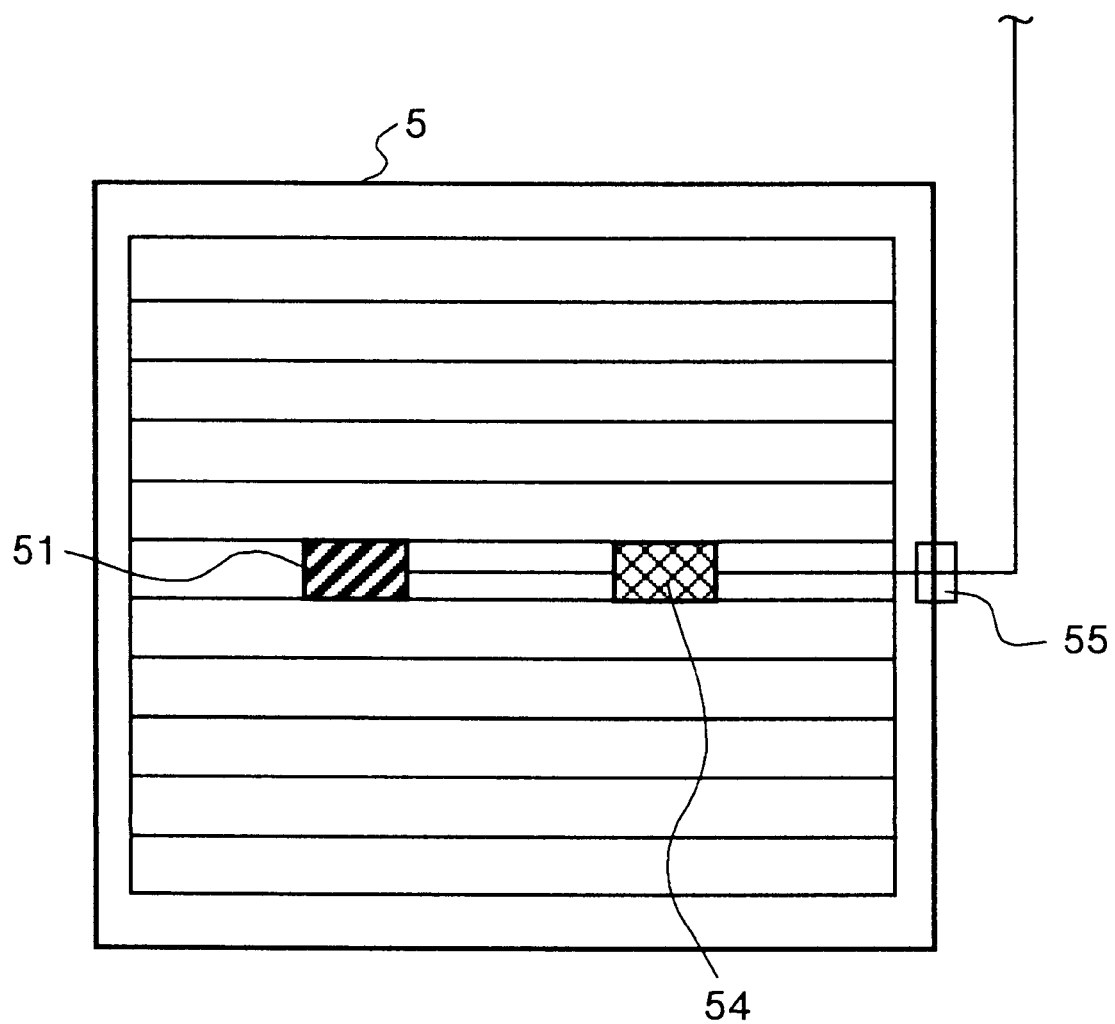
FIG. 19 is a layout diagram showing still another example of the layout during designing according to the present invention.

At this time, as shown in the layout diagram of FIG. 19 for example, the wire is distributed in the block 5 so that the wire passes through a root clock driver 51, a buffer 54 which was added at the time of generation of the clock tree in the higher level block and a temporary terminal 55 set at step S904.

Thereafter, a wires is distributed automatically in the higher level block (step S911). At this time, as shown in the layout diagram of FIG. 19 for example, the wire is distributed so that a terminal (not shown) to which a clock signal is supplied is connected with the temporary terminal 55 set at step S904. Then, the process is completed.

According to the fourth embodiment, similarly to the first embodiment, also in the design between the blocks in the higher level block, the layout where the clock skew is as small as possible can be designed automatically. Moreover, since the block terminal, which is assumed in order to calculate the delay value at the time of generation of the clock tree in the lower level block, is used as the temporary terminal, and the wire is distributed automatically by utilizing the position of the temporary terminal, the clock skew can be adjusted more accurately and securely.

In the fourth embodiment, in addition to the first embodiment in the case that a block such as a hard macro where a clock tree cannot be generated in the lower level block (hereinafter, a hard macro-block) exists, a buffer for adjusting a clock skew of the hard macro-block is placed in another block, and a wire is distributed between the buffer and the hard macro-block.

The hardware structure of the layout design apparatus as the layout design system of semiconductor IC device according to the fifth embodiment of the present invention is also the same as the hardware structure of the first embodiment shown in FIG. 1. Therefore, the description of the hardware structure is omitted.

Figure 10:
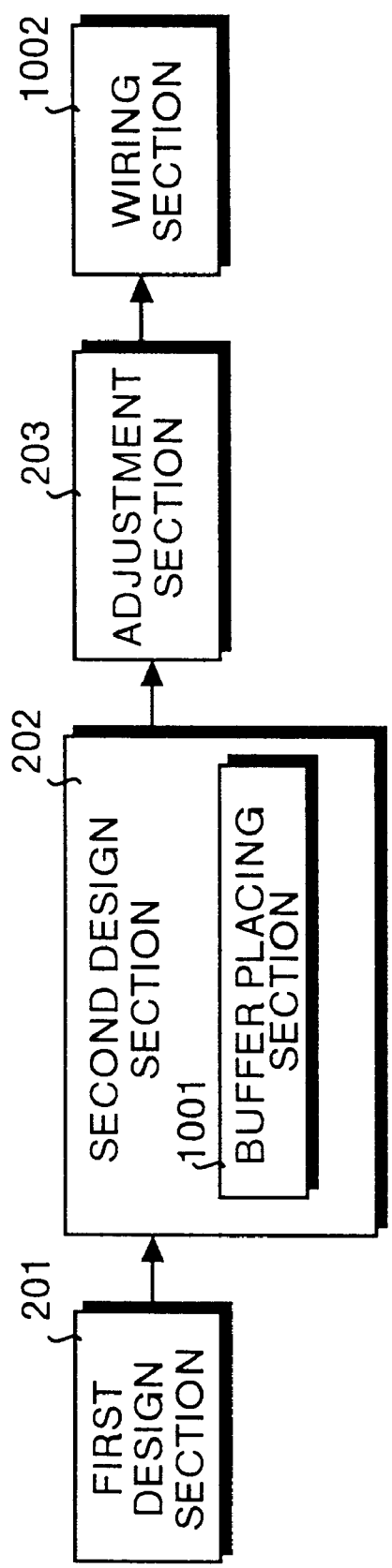
FIG. 10 is a functional block diagram showing a functional structure of the layout design apparatus according to a fifth embodiment of the present invention.

FIG. 10 is a functional block diagram showing a functional structure of the layout design apparatus as the layout design system of semiconductor IC device according to the fifth embodiment of the present invention. Here, the same reference numerals are given to the components which are the same as those in the first embodiment shown in FIG. 2, and the description thereof is omitted.

As shown in FIG. 10, the layout design apparatus of semiconductor IC circuit is composed of the first design section 201, the second design section 202, the adjustment section 203 and a wiring section 1002. The second design section 202 has a buffer placing unit 1001.

In order to adjust clock skew in a specific block, the buffer placing unit 1001 places a buffer in another block different from the specific block. Moreover, the wiring section 1002 connects the buffer set by the buffer placing unit 1001 with the specific block.

Here, the CPU 101 and the like execute a command process according to a command described in the program recorded on the recording medium such as the ROM 102, RAM 103 or HD 105 so that the buffer placing unit 1001 and the wiring section 1002 realize the respective functions.

Figure 11:
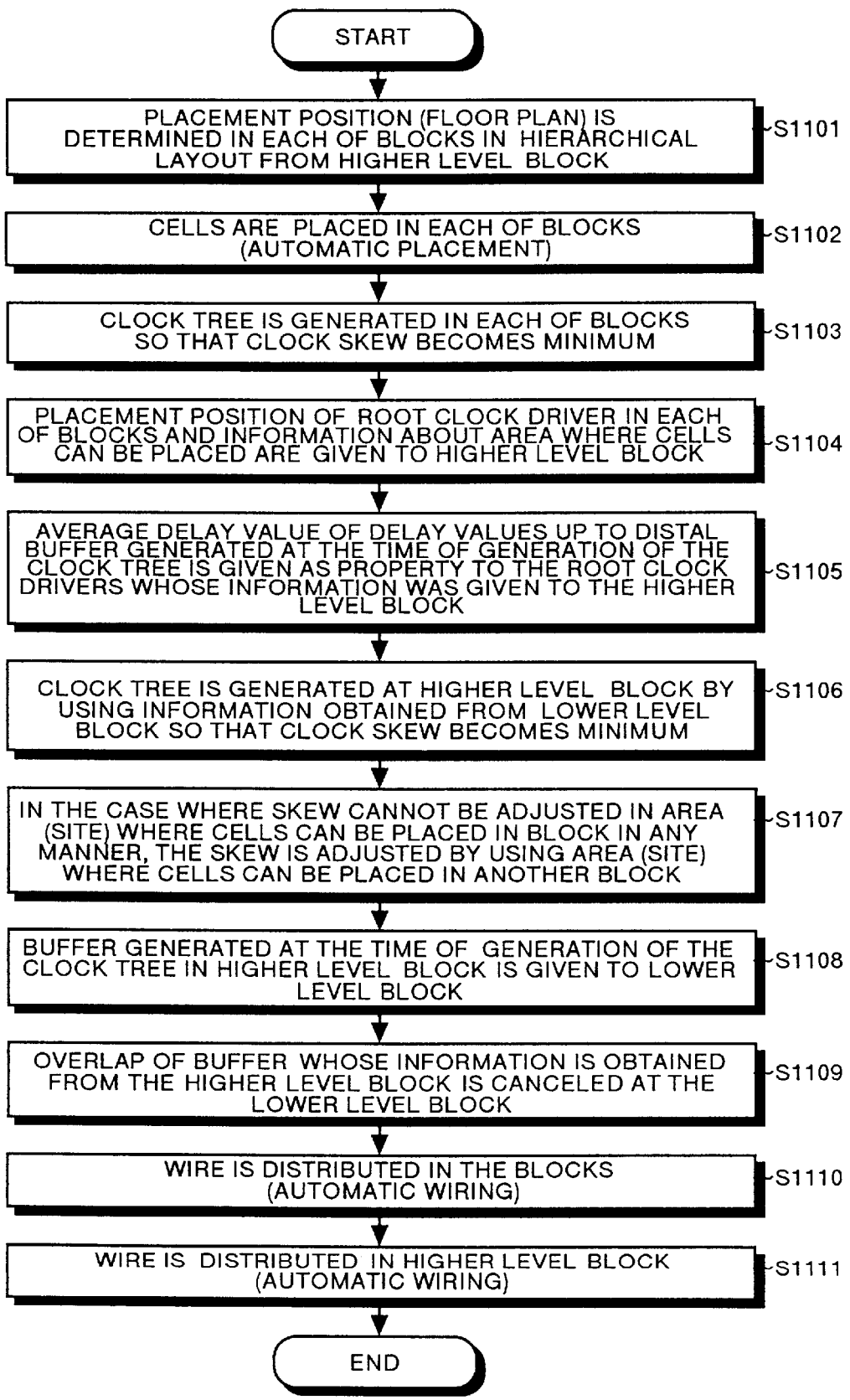
FIG. 11 a flow chart showing a layout design method according to the fifth embodiment of the present invention.

FIG. 11 is a flow chart showing the layout design method according to the fifth embodiment of the present invention. When the layout design process of the fifth embodiment is started, at first a layout in each of blocks, namely, a floor plan is designed in the hierarchy layout from the higher level block (step S1101). Next, cells are placed in each of the blocks automatically based on the floor plans generated at step S1101 (step S1102).

When the cell layout in the block is completed, a root clock driver and a buffer for adjusting clock skew are placed in each of the blocks so that the clock skew becomes minimum in each of the blocks. As a result, a clock tree is generated (step S1103).

When the clock tree in the lower level block is generated, the information about the placement position of the root clock driver and site in each of the blocks is given to the higher level block (step S1104). Then, an average delay value of the delay values from the respective root clock driver to a distal buffer in the clock tree at the lower level block is given as property to each of the root clock driver whose information was given to the higher level block (step S1105).

A buffer is generated additionally and suitably based on the information obtained from the lower level block so that the clock skew in the higher level block becomes minimum, and a clock tree is generated (step S1106).

At this time, in the case where the clock skew cannot be adjusted in a site in the block, namely for example, in the case where a buffer cannot be additionally placed in a hard macro-block, a buffer is placed in a site of another block. The clock skew of the hard macro-block and the like is adjusted by using the buffer prepared in another block (step S1107).

Figure 20:
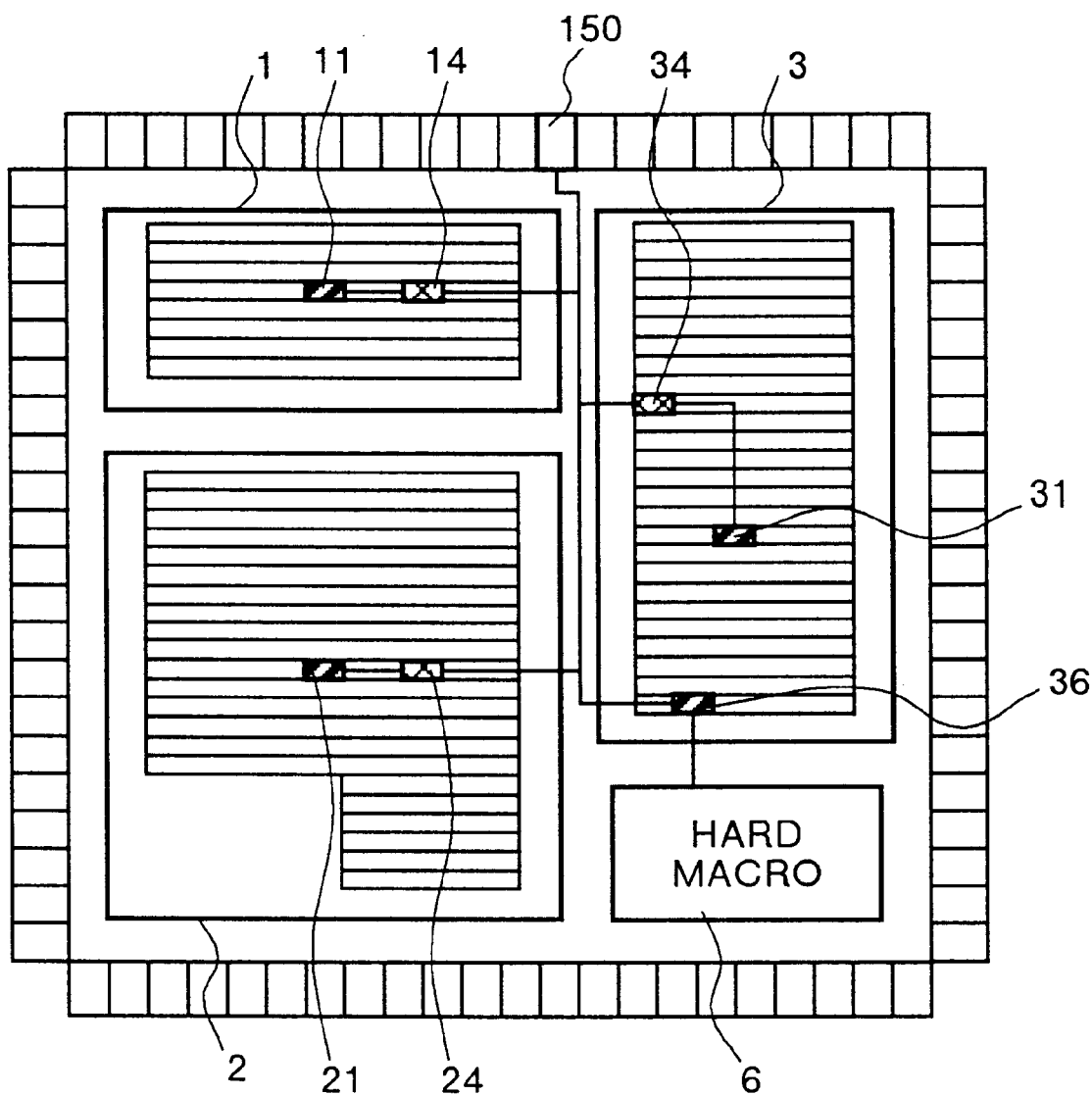
FIG. 20 is a layout diagram showing still another example of the layout during designing according to the present invention.

As shown in the layout diagram of FIG. 20 for example, a buffer 36 for adjusting the clock skew in the hard macro-block 6 is placed in another block 3.

Next, the information about the buffer in the higher level block generated additionally at step S1107 is given to the lower level block (step S1108). The information about the buffer given to the lower level block includes information that the hard macro-block 6 is connected with the buffer 36 in another block 3 by wiring. Overlap of the buffers whose information is obtained from the higher level block is canceled in the lower level block (step S1109). When the overlap of the buffers is canceled, a wire is distributed automatically in each of the blocks (step S1110).

Further, a wire is distributed automatically in the higher level block (step S1111). At this time, as shown in the layout diagram of FIG. 20 for example, the hard macro-block 6 is connected with the buffer 36 in another block 3 by the wiring. Then, the process is completed.

According to the fifth embodiment, similarly to the first embodiment, also in the design between the higher level block, the layout where the clock skew is as small as possible can be designed automatically. Moreover, in the case where a lower level block in which a clock tree cannot be generated block exists, the clock skew in such a block can be adjusted.

The present invention is not limited to the above embodiments, and it can be modified variously. For example in the fifth embodiment, in a block where a buffer is placed in a sites of this block so that the clock skew can be adjusted, a buffer for adjusting the clock skew may be placed in another block in the similar manner to the hard macro-block.

Here, the layout design method described in the first to fifth embodiments can be realized by executing a previously prepared programs using a personal computer or a computer such as a work station. For example, the programs are executed by using ordinary Design Automation. The layout diagrams in FIG. 12 through FIG. 20 referred in the description of the flow charts are not always outputted to a monitor (display 108) or a printer 114 connected with the Design Automation.

In addition, the programs are recorded on the computer-readable recording medium such as a hard disk, floppy disk, CD-ROM, MO and DVD, and are read from these recording medium by a computer so as to be executed. The programs can be distributed through the recording medium or through a network as a transmission medium.

As described above, according to the present invention, in order to design a hierarchical layout, not only in a design in each of the lower level block but also a design between the blocks, a layout where the clock skew is as small as possible can be designed automatically.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A layout design system of semiconductor IC device, comprising:

a first design section which decides a placement position of a clock buffer to be a basis of a clock signal in each of a plurality of blocks whose cell layout has been fixed, and also designs a first clock tree in each block based on the decided placement position of the clock buffer;

a second design section, which designs a second clock tree between the blocks based on the placement position of the clock buffer in the blocks decided by said first design section and based on a delay value of the clock signal propagated in the first clock tree, and for adding an additional buffer; and an adjustment section which adjusts a placement position of the additional buffer so that the placement position of the additional buffer is in accordance with tee placement position of at least one of the cells of the corresponding block if there is the additional buffer added by said second design section.

2. A layout design system of semiconductor IC device, comprising:

a first design section which decides a first clock tree between a plurality of blocks based on a placement position of a clock buffer to be a basis of a clock signal in the blocks and based on a delay value of the clock signal propagated in the first clock tree and a size of each of the blocks, the first clock tree is designed so that a first clock skew in the first clock tree becomes minimum;

a second design section which designs a cell layout in the blocks by taking a placement position of an additional buffer into consideration if there is the additional buffer added by said first design section; and a third design section which designs a second clock tree in the blocks based on the cell layout designed by said second design section, the second clock tree is designed so that a second clock skew in the second clock tree to be a target is the first clock skew.

3. A layout design method of designing a layout of a semiconductor IC device, the method comprising:

a first step of deciding a placement position of a clock buffer to be a basis of a clock signal in each of a plurality of blocks whose cell layout has been fixed and also designing a first clock tree in each block based on the decided placement position of the clock buffer;

a second step of designing a second clock tree between the blocks based on the placement position of the clock buffer in the blocks decided at the first step and based on a delay value of the clock signal propagated in the first clock tree, and further adding an additional buffer; and a third step of adjusting a placement position of the additional buffer so that the placement position of the additional buffer is in accordance with the placement position of at least one of the cells of the corresponding block if there is the additional buffer added at the second step.

4. The layout design method of designing a layout of a semiconductor IC device according to claim 3, wherein the second step further includes, a fourth step of setting a plurality of clock buffers with different delay time in each block; and a fifth step of selecting one of the clock buffers set at said fourth step based on the delay time so as to decide the clock buffer in the corresponding block.

5. The layout design method of designing a layout of a semiconductor IC device according to claim 3, wherein the first step further includes the step of setting a virtual terminal in order to specify a wiring path in each of said blocks to be a basis when the clock tree is designed in each block, and wherein the third step further includes the step of distributing a wire in each block in such a manner that the wire passes through said virtual terminal.

6. The layout design method of designing a layout of a semiconductor IC device according to claim 3, wherein the second step further includes the step of placing a buffer in another block which is different from a target block to adjust a clock skew in the target block, and wherein the third step further includes the step of connecting the buffer with the target block by wiring.

7. A layout design method of designing a layout of a semiconductor IC device, the method comprising:
- a first step of designing a first clock tree between a plurality of blocks based on a placement position of a clock buffer to be a basis of a clock signal in the blocks and based on a delay value of the clock signal propagated in the first clock tree and a size of each of the blocks, the first clock tree is designed so that a fist clock skew in the first clock tree becomes minimum;
- a second step of designing a cell layout in the blocks by taking a placement position of an additional buffer into consideration if there is the additional buffer added at the first step; and
- a third step of designing a second clock tree in the blocks based on the cell layout designed at the second step, the second clock tree is designed so that a second clock skew in the second clock tree to be a target is the first clock skew.

8. A computer-readable recording medium wherein programs which allow a computer to realize the following sections is recorded thereon;
- a first design section which decides a placement position of a dock buffer to be basis of a clock signal in each of a plurality of blocks whose cell layout has been fixed, and also designs a first clock tree in each block based on the decided placement position of the clock buffer;
- a second design section, which designs a second clock tree between the blocks based on the placement position of the clock buffer in the blocks decided by said first design section and based on a delay value of the clock signal propagated in the first clock tree, and for adding an additional buffer; and
- an adjustment section which adjusts a placement position of the additional buffer so that the placement position of the additional buffer is in accordance with the placement position of at least one of the cells of the corresponding block if there is the additional buffer added by said second design section.

9. A computer-readable recording medium wherein programs which allow a computer to realize the following sections is recorded thereon:
- a first design section which decides a first clock tree between a plurality of blocks based on a placement position of a clock buffer to be a basis of a clock signal in the blocks and based on a delay value of the clock signal propagated in the first clock tree and a size of each of the blocks, the first clock tree is designed so that a first clock skew in the first clock tree becomes minimum;
- a second design section which designs a cell layout in the blocks by taking a placement position of an additional buffer into consideration if there is the additional buffer added by said first design section; and
- a third design section which designs a second clock tree in the blocks based on the cell layout designed by said second design section, the second clock tree is designed so that a second clock skew in the second clock tree to be a target is the fist clock skew.

10. A computer-readable recording medium wherein programs which allow a computer to execute the following steps is recorded thereon:
- a first step of deciding a placement position of a clock buffer to be a basis of a clock signal in each of a plurality of blocks whose cell layout has been fixed and also designing a first clock tree in each block based on the decided placement position of a clock buffer;
- a second step of designing a second clock tree between the blocks based on the placement position of the clock buffer in the blocks decided at the first step and based on a delay value of the clock signal propagated in the first clock tree, and further adding an additional buffer; and
- a third step of adjusting a placement position of the additional buffer so that the placement position of the additional buffer is in accordance with the placement position of a least one of the cells of the corresponding block if there is the additional buffer added at the second step.

11. A computer-readable recording medium wherein programs which allow a computer to execute the following steps is recorded thereon:
- a first step of designing a first clock tree between a plurality of blocks based on a placement position of a clock buffer to be a basis of a clock signal in the blocks and based on a delay value of the clock signal propagated in the first clock tree and a size of each of the blocks, the first clock tree is designed so that a first clock skew in the first clock tree becomes minimum;
- a second step of designing a cell layout in the blocks by taking a placement position of an additional buffer into consideration if there is the additional buffer added at the first step; and
- a third step of designing a second clock tree in the blocks based on the cell layout designed at the second step, the second clock tree is designed so that a second clock skew in the second clock tree to be a target is the first clock skew.

12. A layout design system of semiconductor IC device, which semiconductor IC device having a plurality of blocks, said system comprising:
- a cell layout fixing section which fixes a cell layout of the blocks;
- a placement deciding section which decides a placement position of a clock buffer, which clock buffer generates a required clock signal in each blocks, in each block whose cell layout has been fixed by said cell layout fixing section;
- a clock tree designing section which designs a clock tree in each block based on the placement of the clock buffer decided by said placement deciding section;
- a delay value calculating section which propagates a clock signal in the blocks and obtains a delay value of the clock signal in each block;
- an intra-block clock tree designing section which designs a clock tree between the blocks based on the placement position of the clock buffer decided by said placement deciding section and also based on the delay value of the clock signal calculated by said delay value calculating section;
- a buffer generating section which generates a buffer in a block in order to adjust a clock skew; and
- an adjustment section which adjusts a placement position of a buffer generated by said buffer adding section based on the cell layout.

13. A layout design system of semiconductor IC device, comprising:
- a first design section which decides a placement position of a clock buffer to be a basis of a clock signal in each of a plurality of blocks whose cell layout has been fixed, and also designs a first clock tree in each block based on the decided placement position of the clock buffer;

a second design section, which designs a second clock tree between the blocks based on the placement position of the clock buffer in the blocks decided by said first design section and based on a delay value of the clock signal propagated in the first clock tree, and for adding an additional buffer; and an adjustment section which adjusts a placement position of the additional buffer so that the overlap of placement position between the additional buffer and at least one of the cells of the corresponding block is canceled if there is the additional buffer added by said second design section.

14. A layout design method of designing a layout of a semiconductor IC device, the method comprising:

a first step of deciding a placement position of a clock buffer to be a basis of a clock signal in each of a plurality of blocks whose cell layout has been fixed, and also designs a first clock tree in each block based on the decided placement position of the clock buffer;

second step of designing a second clock tree between the blocks based on the placement position of the clock buffer in the blocks decided at the first step and based on a delay value of the clock signal propagated in the first clock tree, and further adding an additional buffer, and further adding an additional buffer; and a third step of adjusting a placement position of the additional buffer so that the overlap of placement position between the additional buffer and at least one of the cells of the corresponding block is canceled if there is the additional buffer added at the second step.

15. A computer-readable recording medium wherein programs which allow a computer to realize the following sections is recorded thereon:

a first design section which decides a placement position of a clock buffer to be a basis of a clock signal in each of a plurality of blocks whose cell layout has been fixed, and also designs a first clock tree in each block based on the decided placement position of the clock buffer;

a second design section, which designs a second clock tree between the blocks based on the placement position of the clock buffer in the blocks decided by said first design section and based on a delay value of the clock signal propagated in the first clock tree, and for adding an additional buffer; and an adjustment section which adjusts a placement position of the additional buffer so that the overlap of placement position between the additional buffer and at least one of the cells of the corresponding block is canceled if there is the additional buffer added by said second design section.

* * * * *